(12) United States Patent
Mimura et al.

(10) Patent No.: US 12,690,380 B2
(45) Date of Patent: Jul. 21, 2026

(54) DISPLAY DEVICE MANUFACTURING METHOD

(71) Applicant: Magnolia White Corporation, Tokyo (JP)

(72) Inventors: Toshifumi Mimura, Tokyo (JP); Hiraaki Kokame, Tokyo (JP); Arichika Ishida, Tokyo (JP); Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 645 days.

(21) Appl. No.: 18/157,844

(22) Filed: Jan. 23, 2023

(65) Prior Publication Data

US 2023/0240126 A1 Jul. 27, 2023

(30) Foreign Application Priority Data

Jan. 25, 2022 (JP) ................................. 2022-009506

(51) Int. Cl.
*H10K 71/60* (2023.01)
*H10K 59/12* (2023.01)
*H10K 71/20* (2023.01)

(52) U.S. Cl.
CPC ......... *H10K 71/60* (2023.02); *H10K 59/1201* (2023.02); *H10K 71/231* (2023.02)

(58) Field of Classification Search
CPC ... H10K 59/1201; H10K 71/231; H10K 71/60
See application file for complete search history.

(56) References Cited

U.S. PATENT DOCUMENTS

| | | | |
|---|---|---|---|
| 12,356,839 B2 * | 7/2025 | Lee | H10K 59/879 |
| 2004/0160170 A1 | 8/2004 | Sato et al. | |
| 2004/0201048 A1 * | 10/2004 | Seki | H05B 33/10 |
| | | | 438/70 |

(Continued)

FOREIGN PATENT DOCUMENTS

| | | |
|---|---|---|
| JP | 5-129248 A | 5/1993 |
| JP | 2000-195677 A | 7/2000 |

(Continued)

OTHER PUBLICATIONS

Japanese Office Action issued Jul. 29, 2025, in corresponding JP Application No. 2022-009506, 14pp.

*Primary Examiner* — Marlon T Fletcher
*Assistant Examiner* — Kimberly Newman Frey
(74) *Attorney, Agent, or Firm* — XSENSUS LLP

(57) ABSTRACT

According to one embodiment, a display device manufacturing method includes preparing a processing substrate including a lower electrode, a rib including and a partition, forming a first organic layer covering the lower electrode, and a second organic layer located on the upper portion, forming a first upper electrode located on the first organic layer and a second upper electrode located on the second organic layer, forming a sealing layer, forming a resist covering a part of the sealing layer, performing anisotropic dry etching using the resist as a mask to reduce a thickness of the sealing layer exposed from the resist, and performing isotropic dry etching using the resist as a mask and using a mixture gas of fluorine-based gas and oxygen to remove the sealing layer exposed from the resist.

14 Claims, 12 Drawing Sheets

(56) References Cited

U.S. PATENT DOCUMENTS

| | | | |
|---|---|---|---|
| 2009/0009069 A1 | 1/2009 | Takata | |
| 2014/0117334 A1* | 5/2014 | Nakamura | H10K 50/805 |
| | | | 257/40 |
| 2019/0363275 A1 | 11/2019 | Ochi et al. | |
| 2022/0006051 A1* | 1/2022 | Takahashi | H05B 33/06 |
| 2022/0128411 A1* | 4/2022 | Ocak | H10F 39/026 |
| 2022/0367585 A1* | 11/2022 | Lee | H10K 59/123 |
| 2023/0197507 A1* | 6/2023 | Xu | H10B 43/27 |
| | | | 257/774 |
| 2023/0217730 A1* | 7/2023 | Tabatake | H10K 59/122 |
| | | | 257/40 |
| 2023/0352644 A1* | 11/2023 | Lee | H10H 20/857 |
| 2024/0421247 A1* | 12/2024 | Wi | H10H 20/01 |

FOREIGN PATENT DOCUMENTS

| | | | |
|---|---|---|---|
| JP | 2004-207217 A | 7/2004 |
| JP | 2008-135325 A | 6/2008 |
| JP | 2009-32673 A | 2/2009 |
| JP | 2010-118191 A | 5/2010 |
| JP | 2023102959 A | 7/2023 |
| WO | 2018/179308 A1 | 10/2018 |

* cited by examiner

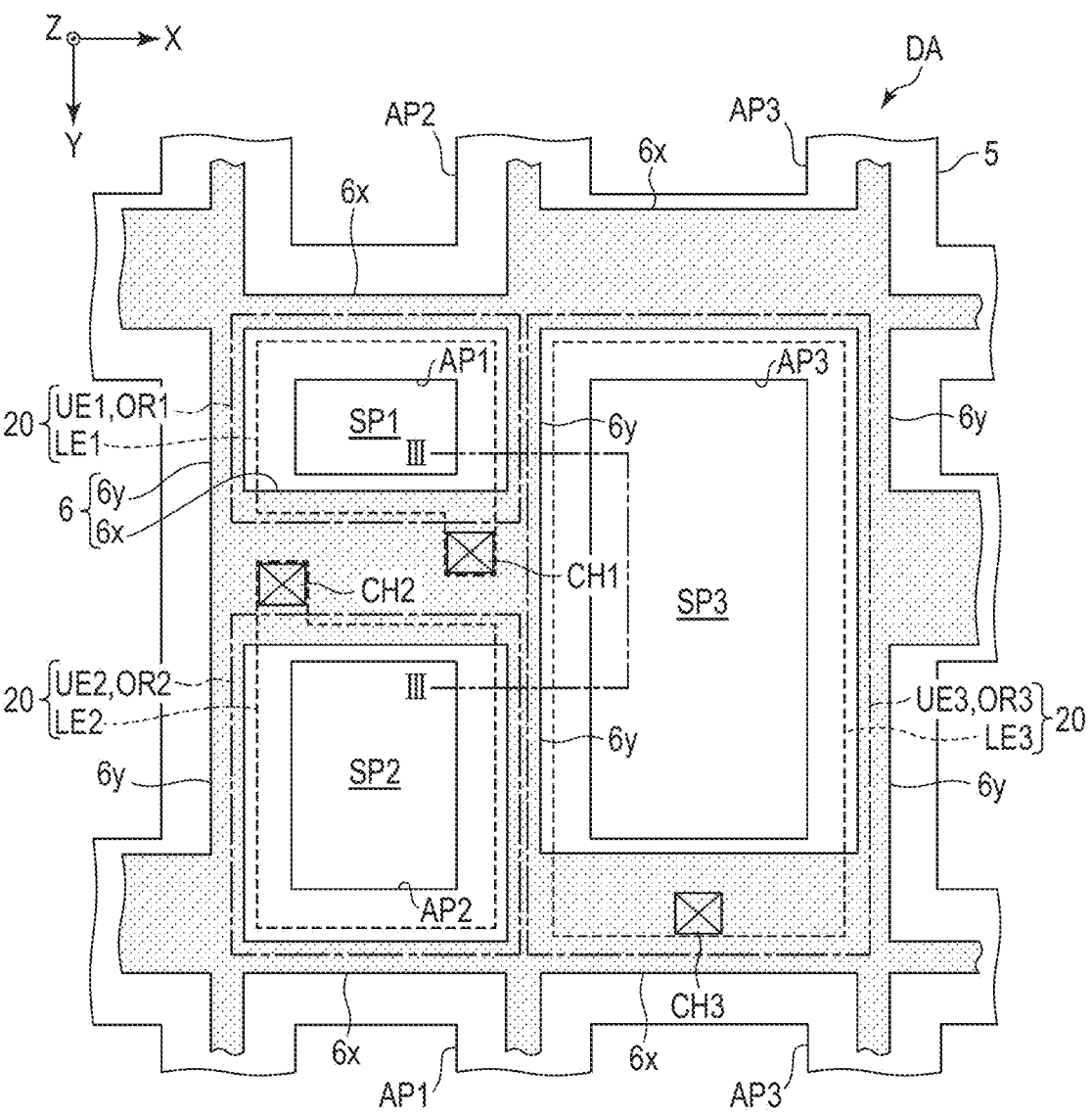
F I G. 2

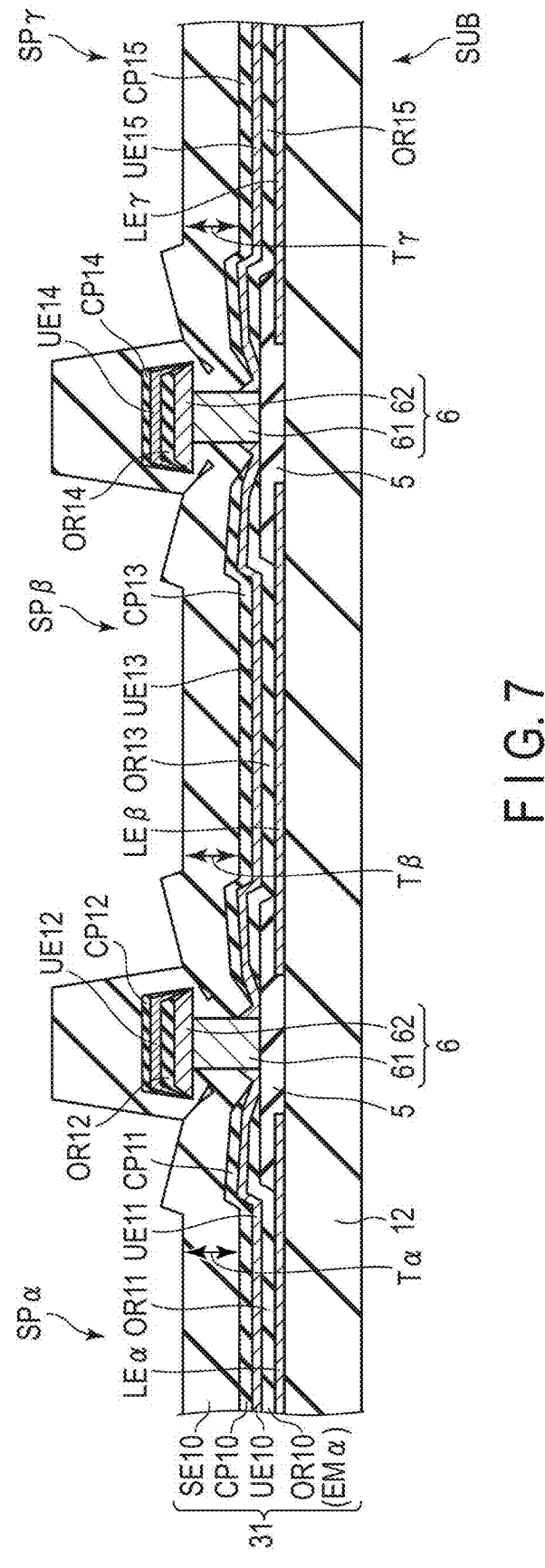
F I G. 7

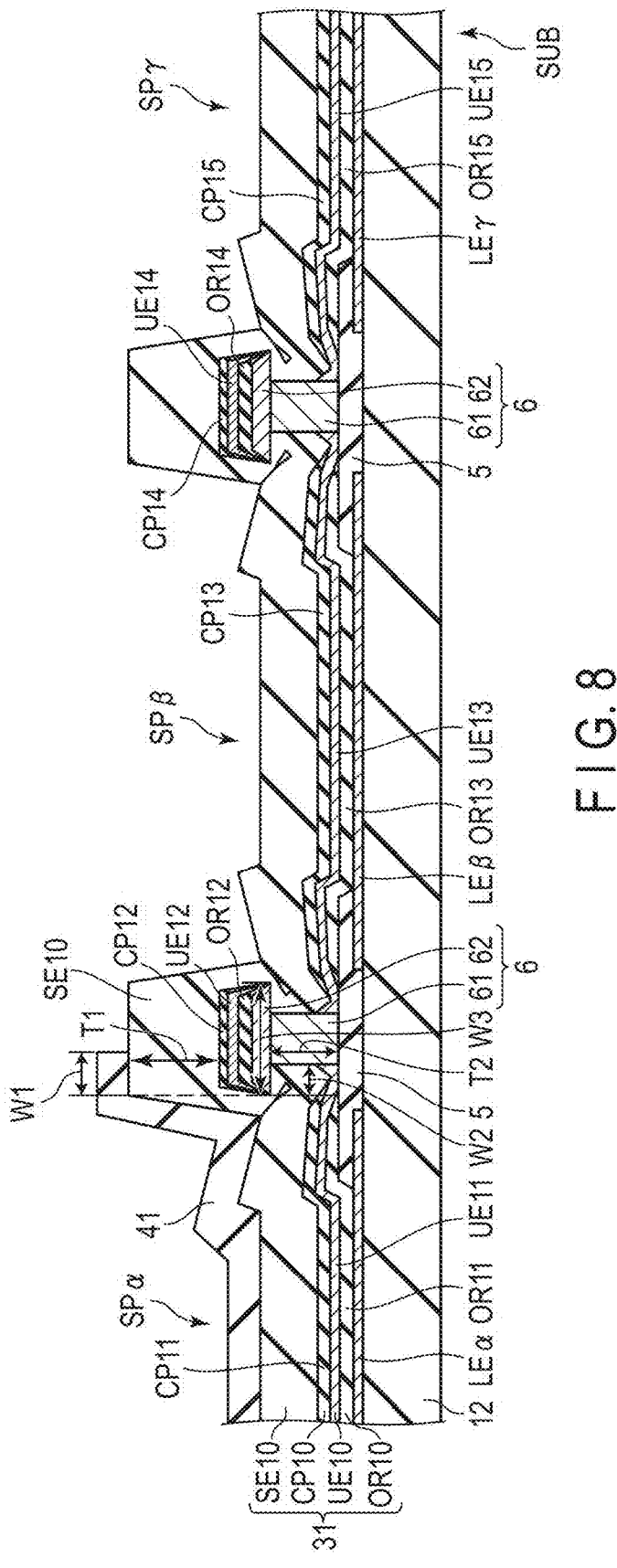
F I G. 8

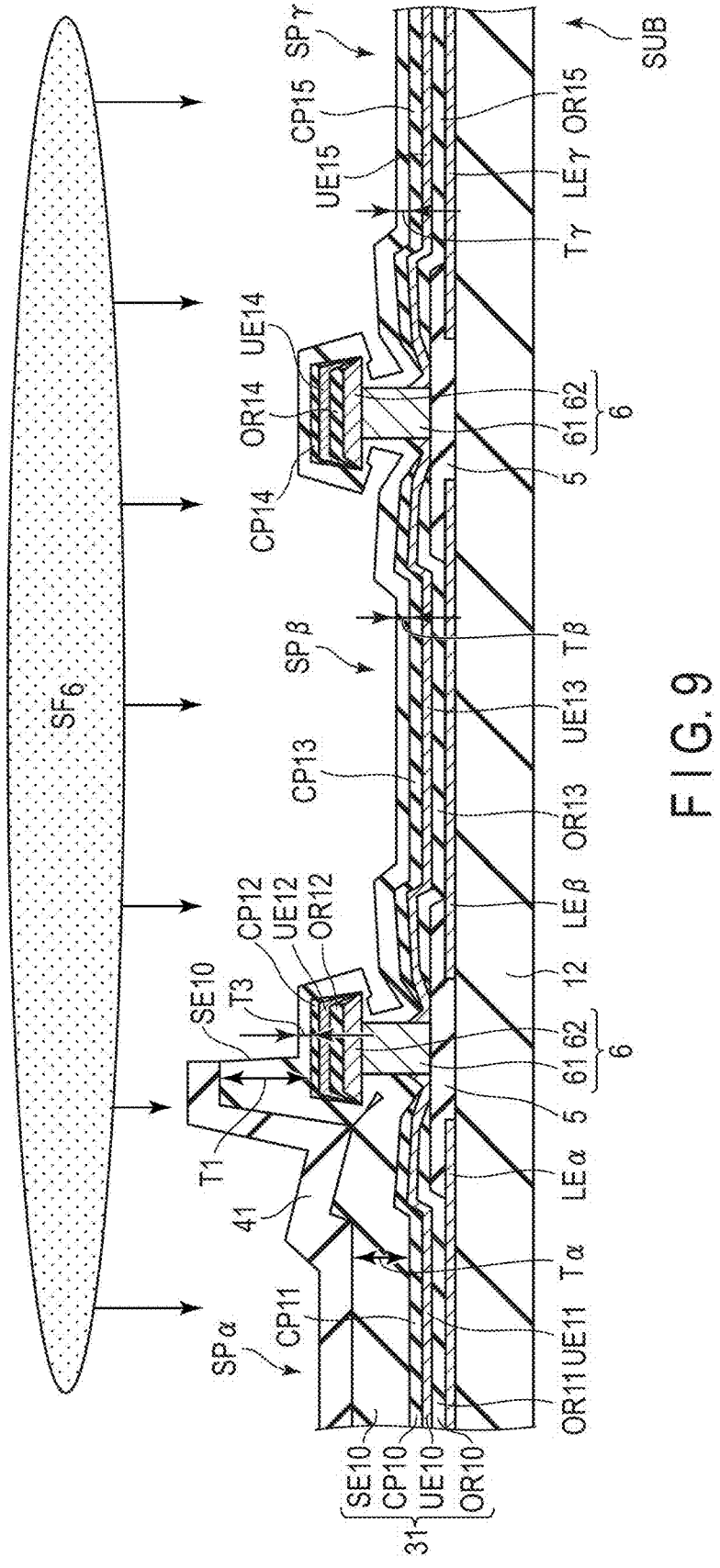
F I G. 9

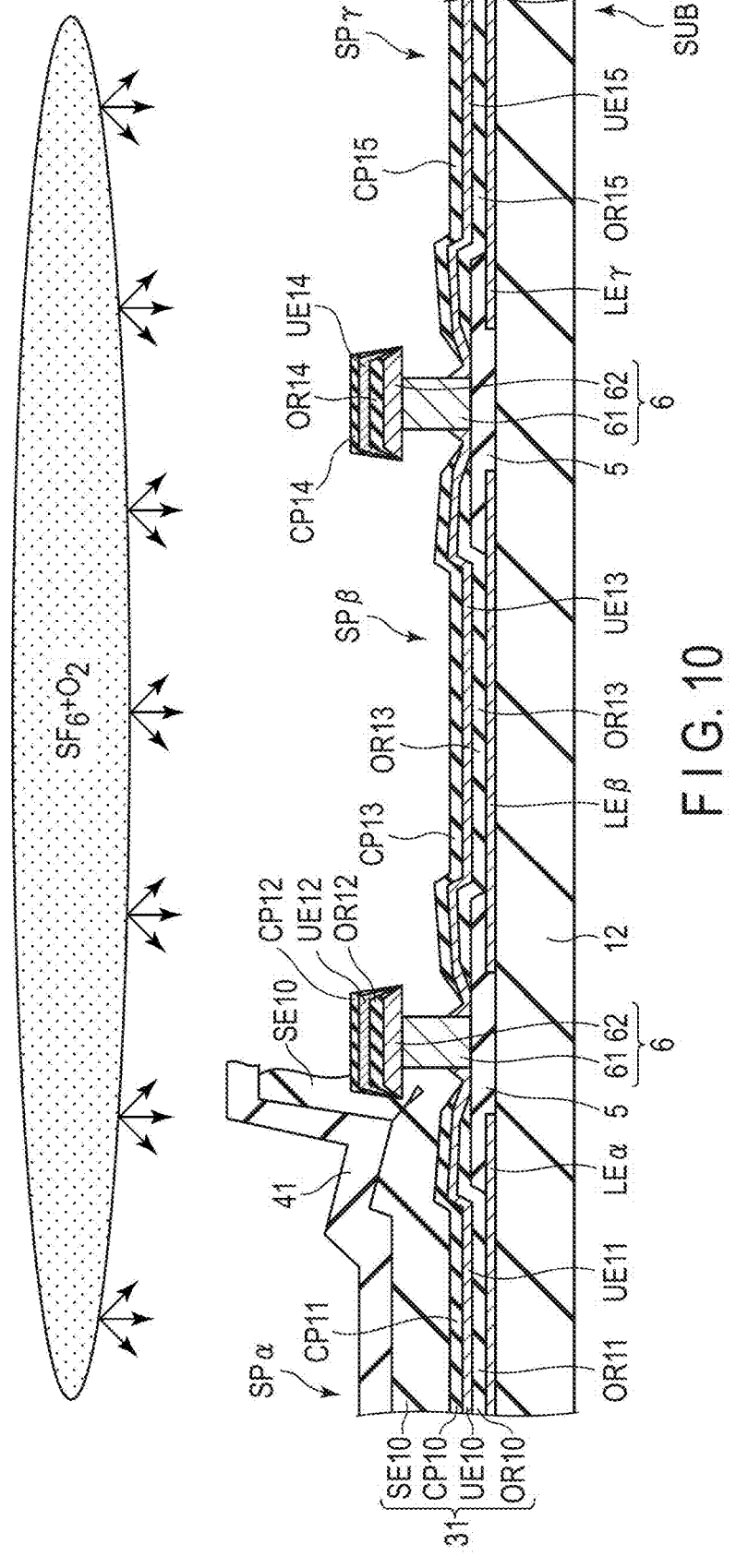
F I G. 10

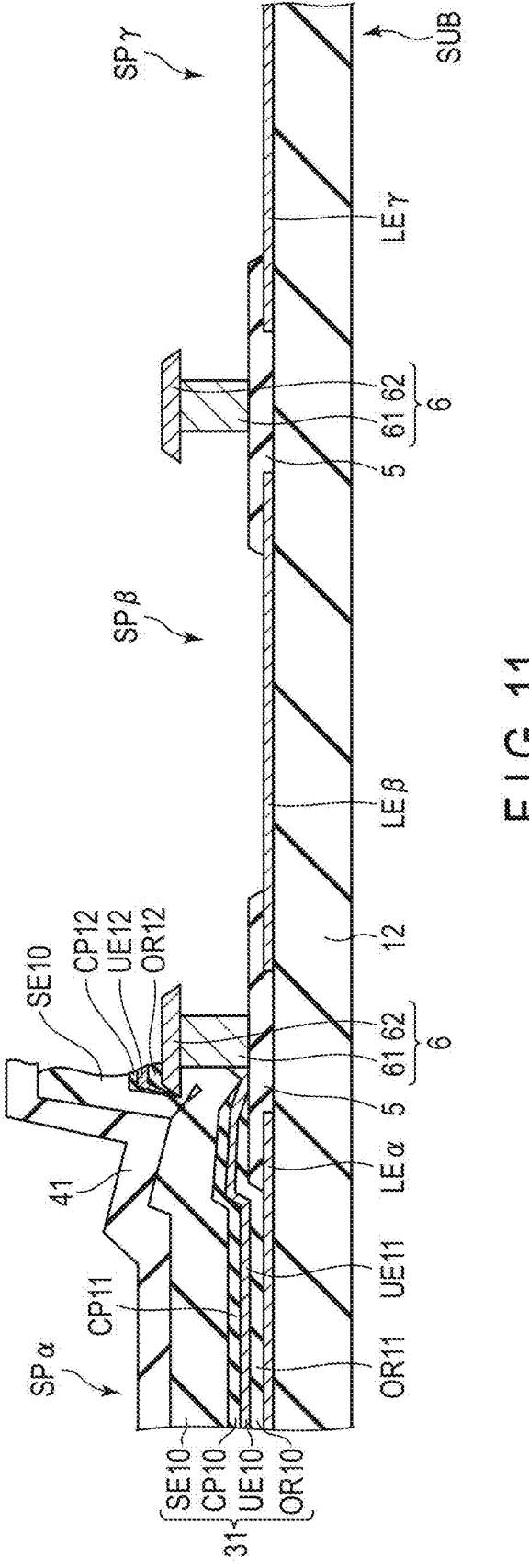
F I G. 11

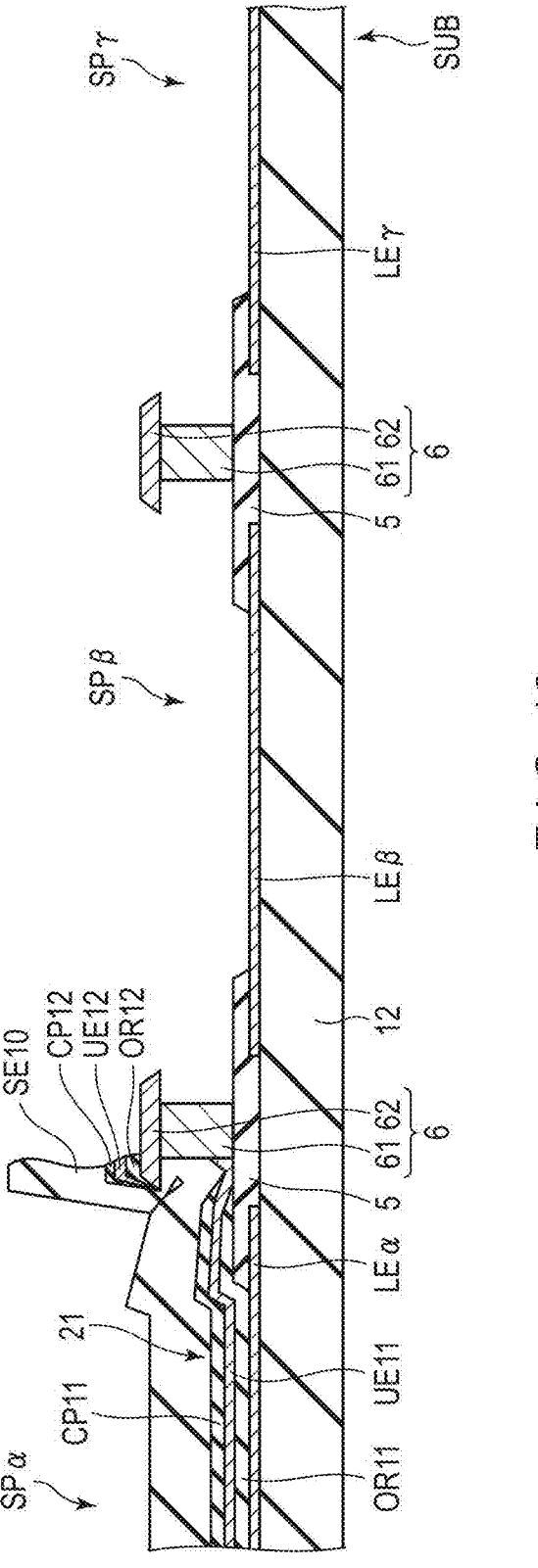
F I G. 12

| | $SF_6 : O_2$ | Product |
|---|---|---|
| Experiment 1 | 100 : 0 | Present |
| Experiment 2 | 90 : 10 | Present |
| Experiment 3 | 70 : 30 | Absent |

F I G. 13

DISPLAY DEVICE MANUFACTURING METHOD

CROSS-REFERENCE TO RELATED APPLICATIONS

This application is based upon and claims the benefit of priority from Japanese Patent Application No. 2022-009506, filed Jan. 25, 2022, the entire contents of which are incorporated herein by reference.

FIELD

Embodiments described herein relate generally to a display device manufacturing method.

BACKGROUND

Recently, display devices with organic light-emitting diodes (OLEDs) applied thereto as display elements have been put into practical use. This display device comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer in addition to a light emitting layer.

Such display elements are easily degraded by moisture. For this reason, a technology to securely seal the display elements is required.

BRIEF DESCRIPTION OF THE DRAWINGS

FIG. 2 is a view showing an example of a layout of the sub-pixels SP1, SP2, and SP3.

FIG. 7 is a view illustrating a process of forming a first thin film.

FIG. 8 is a view illustrating a process of forming a resist.

FIG. 9 is a view illustrating first etching (anisotropic dry etching) of the first thin film.

FIG. 10 is a view illustrating second etching (isotropic dry etching) of the first thin film.

FIG. 11 is a view illustrating third etching of the first thin film.

FIG. 12 is a view illustrating a process of removing a resist.

FIG. 13 is a table summarizing the mixture ratios of gases used for isotropic dry etching and the presence or absence of the product.

DETAILED DESCRIPTION

Figure 1:
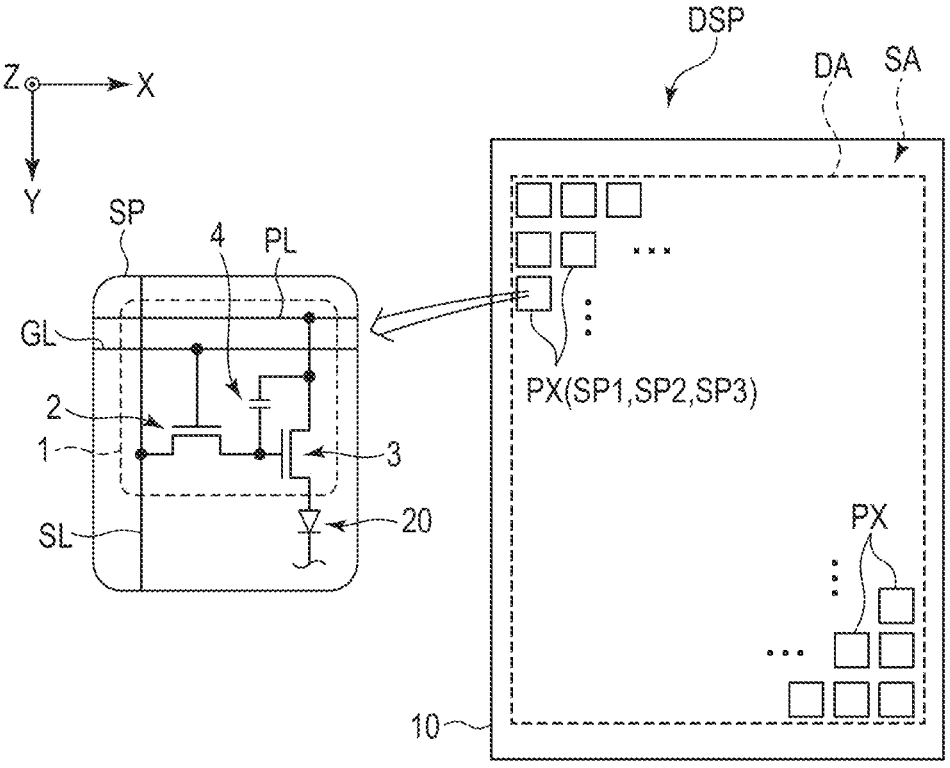
FIG. 1 is a view showing a configuration example of a display device DSP.

The embodiments described herein aim to provide a display device manufacturing method capable of improving reliability.

In general, according to a display device manufacturing method comprises: preparing a processing substrate where a lower electrode, a rib including an aperture overlapping the lower electrode, and a partition including a lower portion arranged on the rib and an upper portion arranged on the lower portion and protruding from a side surface of the lower portion, are formed above a substrate; forming a first organic layer covering the lower electrode, and a second organic layer separated from the first organic layer and located on the upper portion; forming a first upper electrode located on the first organic layer and being in contact with the lower portion, and a second upper electrode separated from the first upper electrode and located on the second organic layer; forming a sealing layer located above the first upper electrode and the second upper electrode and covering the partition; forming a resist covering a part of the sealing layer; performing anisotropic dry etching using the resist as a mask to reduce a thickness of the sealing layer exposed from the resist; and performing isotropic dry etching using the resist as a mask and using a mixture gas of fluorine-based gas and oxygen to remove the sealing layer exposed from the resist.

According to the embodiments, a display device manufacturing method capable of improving reliability can be provided.

An embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. Viewing various elements parallel to the third direction Z is referred to as planar view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP.

The display device DSP has a display area DA where images are displayed and a surrounding area SA around the display area DA, on an insulating substrate 10. The substrate 10 may be glass or a flexible resin film.

In the embodiment, the shape of the substrate 10 in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX comprises a plurality of sub-pixels SP. For example, the pixel PX comprises a red sub-pixel SP1, a green sub-pixel SP2, and a blue sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

In the pixel switch 2, a gate electrode is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to an anode of a display element 20.

The configuration of the pixel circuit 1 is not limited to the example shown in the figure. For example, the pixel circuit 1 may comprise more thin-film transistors and capacitors.

The display element 20 is an organic light-emitting diode (OLED) as a light-emitting element and may be referred to as an organic EL element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

FIG. 2 is a view showing an example of a layout of the sub-pixels SP1, SP2, and SP3.

In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a column in which the sub-pixels SP1 and SP2 are alternately arranged in the second direction Y and a column in which a plurality of sub-pixels SP3 are arranged in the second direction Y are formed in the display area DA. These columns are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 overlaps with the rib 5 in planar view. The partition 6 includes a plurality of first partitions 6x extending in the first direction X and a plurality of second partitions 6y extending in the second direction Y. The plurality of first partitions 6x are located between the apertures AP1 and AP2 adjacent in the second direction Y and between two apertures AP3 adjacent in the second direction Y. The second partitions 6y are located between the apertures AP1 and AP3 adjacent in the first direction X and between the apertures AP2 and AP3 adjacent in the first direction X.

In the example in FIG. 2, the first partitions 6x and the second partitions 6y are connected to each other. As a result, the partition 6 is formed to have a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3.

In the example in FIG. 2, outlines of the lower electrodes LE1, LE2, and LE3 are represented by dotted lines, and outlines of the organic layers OR1, OR2, and OR3 and the upper electrodes UE1, UE2, and UE3 are represented as one-dot chain lines. A peripheral portion of each of the lower electrodes LE1, LE2, and LE3 overlaps with the rib 5. The outline of the upper electrode UE1 almost matches the outline of the organic layer OR1, and the peripheral portions of the upper electrode UE1 and the organic layer OR1 overlap with the partition 6. The outline of the upper electrode UE2 almost matches the outline of the organic layer OR2, and the peripheral portions of the upper electrode UE2 and the organic layer OR2 overlap with the partition 6. The outline of the upper electrode UE3 almost matches the outline of the organic layer OR3, and the peripheral portions of the upper electrode UE3 and the organic layer OR3 overlap with the partition 6.

The lower electrode LE1, the upper electrode UE1, and the organic layer OR1 constitute the display element 20 of the sub-pixel SP1. The lower electrode LE2, the upper electrode UE2, and the organic layer OR2 constitute the display element 20 of the sub-pixel SP2. The lower electrode LE3, the upper electrode UE3, and the organic layer OR3 constitute the display element 20 of the sub-pixel SP3. For example, the lower electrodes LE1, LE2, and LE3 correspond to the anodes of the display elements 20. The upper electrodes UE1, UE2, and UE3 correspond to the cathodes of the display elements 20 or common electrodes.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

Figure 3:
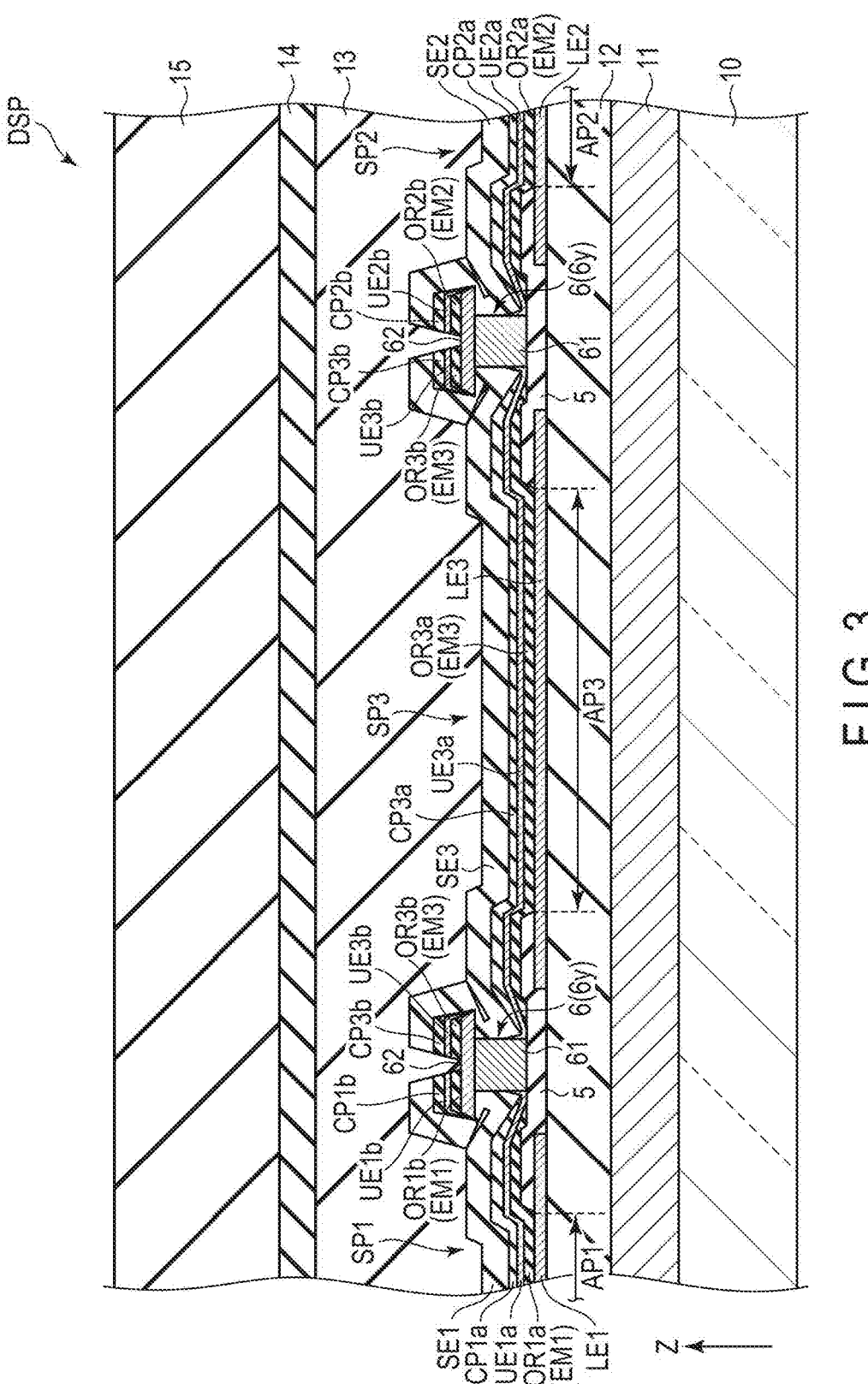
FIG. 3 is a schematic cross-sectional view showing the display device DSP taken along line III-III in FIG. 2.

FIG. 3 is a schematic cross-sectional view showing the display device DSP taken along line III-III in FIG. 2.

A circuit layer 11 is arranged on the above-described substrate 10. The circuit layer 11 includes various circuits such as the pixel circuits 1, and various lines such as the scanning lines GL, the signal lines SL, and the power lines PL shown in FIG. 1. The circuit layer 11 is covered with an insulating layer 12. The insulating layer 12 functions as a planarization film for planarizing uneven parts generated by the circuit layer 11.

The lower electrodes LE1, LE2, and LE3 are arranged on the insulating layer (organic insulating layer) 12. The rib (inorganic insulating layer) 5 is arranged on the insulating layer 12 and the lower electrodes LE1, LE 2, and LE3. End portions of the lower electrodes LE1, LE2, and LE3 are covered with the rib 5.

The partition 6 includes a lower portion (stem) 61 arranged on the rib 5 and an upper portion (shade) 62 that covers an upper surface of the lower portion 61. The upper portion 62 has a width larger than the lower portion 61. As a result, both the end portions of the upper 62 protrude from the side surfaces of the lower portion 61 in FIG. 3. The shape of the partition 6 may be referred to as an overhanging shape.

The organic layer OR1 shown in FIG. 2 includes a first portion OR1*a* and a second portion OR1*b* that are separated from each other as shown in FIG. 3. As shown in FIG. 3, the first portion OR1*a* is in contact with the lower electrode LE1 through the aperture AP1, covers the lower electrode LE1 and partially covers the rib 5. The second portion OR1*b* is located on the upper portion 62.

In addition, the upper electrode UE1 shown in FIG. 2 includes a first portion UE1*a* and a second portion UE1*b* that are separated from each other as shown in FIG. 3. The first portion UE1*a* is opposed to the lower electrode LE1 and is located on the first portion OR1*a*. Furthermore, the first portion UE1*a* is in contact with the side surface of the lower portion 61. The second portion UE1*b* is located above the partition 6 and is located on the second portion OR1*b*.

The organic layer OR2 shown in FIG. 2 includes a first portion OR2*a* and a second portion OR2*b* that are separated from each other as shown in FIG. 3. The first portion OR2*a* is in contact with the lower electrode LE2 through the aperture AP2, covers the lower electrode LE2, and partially overlaps with the rib 5. The second portion OR2*b* is located on the upper portion 62.

In addition, the upper electrode UE2 shown in FIG. 2 includes a first portion UE2*a* and a second portion UE2*b* that are separated from each other as shown in FIG. 3. The first portion UE2*a* is opposed to the lower electrode LE2 and is located on the first portion OR2*a*. Furthermore, the first portion UE2*a* is in contact with the side surface of the lower portion 61. The second portion UE2*b* is located above the partition 6 and is located on the second portion OR2*b*.

The organic layer OR3 shown in FIG. 2 includes a first portion OR3*a* and a second portion OR3*b* that are separated from each other as shown in FIG. 3. The first organic portion OR3*a* is in contact with the lower electrode LE3 through the aperture AP3, covers the lower electrode LE3, and partially overlaps with the rib 5. The second portion OR3*b* is located on the upper portion 62.

In addition, the upper electrode UE3 shown in FIG. 2 includes a first portion UE3*a* and a second portion UE3*b* that are separated from each other as shown in FIG. 3. The first portion UE3*a* is opposed to the lower electrode LE3 and is located on the first portion OR3*a*. Furthermore, the first portion UE3*a* is in contact with the side surface of the lower portion 61. The second portion UE3*b* is located above the partition 6 and is located on the second portion OR3*b*.

In the example of FIG. 3, the sub-pixels SP1, SP2, and SP3 include cap layers (optical adjustment layers) CP1, CP2, and CP3 for adjusting the optical characteristics of the light emitted from the light emitting layers of the organic layers OR1, OR2, and OR3.

The cap layer CP1 includes a first portion CP1*a* and a second portion CP1*b* that are separated from each other. The first portion CP1*a* is located at the aperture AP1 and is located on the first portion UE1*a*. The second portion CP1*b* is located above the partition 6 and is located on the second portion UE1*b*.

The cap layer CP2 includes a first portion CP2*a* and a second portion CP2*b* that are separated from each other. The first portion CP2*a* is located at the aperture AP2 and is located on the first portion UE2*a*. The second portion CP2*b* is located above the partition 6 and is located on the second portion UE2*b*.

The cap layer CP3 includes a first portion CP3*a* and a second portion CP3*b* that are separated from each other. The first portion CP3*a* is located at the aperture AP3 and is located on the first portion UE3*a*. The second portion CP3*b* is located above the partition 6 and is located on the second portion UE3*b*.

Sealing layers SE1, SE2, and SE3 are arranged in the sub-pixels SP1, SP2, and SP3, respectively. The sealing layer SE1 continuously covers each member of the sub-pixel SP1 including the first portion CP1*a*, the partition 6, and the second portion CP1*b*. The sealing layer SE2 continuously covers each member of the sub-pixel SP2 including the first portion CP2*a*, the partition 6, and the second portion CP2*b*. The sealing layer SE3 continuously covers each member of the sub-pixel SP3 including the first portion CP3*a*, the partition 6, and the second portion CP3*b*.

In the example in FIG. 3, the second portion OR1*b*, the second portion UE1*b*, the second portion CP1*b*, and the sealing layer SE1 on the partition 6 between the sub-pixels SP1 and SP3 are separated from the second portion OR3*b*, the second portion UE3*b*, the second portion CP3*b*, and the sealing layer SE3 on the partition 6. In addition, the second portion OR2*b*, the second portion UE2*b*, the second portion CP2*b*, and the sealing layer SE2 on the partition 6 between the sub-pixels SP2 and SP3 are separated from the second portion OR3*b*, the second portion UE3*b*, the second portion CP3*b*, and the sealing layer SE3 on the partition 6.

The sealing layers SE1, SE2, and SE3 are covered with a resin layer 13. The resin layer 13 is covered with a sealing layer 14. Furthermore, the sealing layer 14 is covered with a resin layer 15.

The insulating layer 12 is formed of an organic material. The rib 5 and the sealing layers 14, SE1, SE2, and SE3 are formed of, for example, an inorganic material such as silicon nitride (SiNx). The thickness of the rib 5 formed of an inorganic material is sufficiently small as compared to the thickness of the partition 6 and the insulating layer 12. In one example, the thickness of the rib 5 is 200 nm or more and 400 nm or less.

The lower portion 61 of the partition 6 is formed of a conductive material. Both the lower portion 61 and the upper portion 62 of the partition 6 may be conductive.

The lower electrodes LE1, LE2, and LE3 may be formed of a transparent conductive material such as ITO and may have a multilayer structure of a metallic material such as silver (Ag) and a transparent conductive material. The upper electrodes UE1, UE2, and UE3 are formed of, for example, a metallic material such as an alloy (MgAg) of magnesium and silver. The upper electrodes UE1, UE2, and UE3 may be formed of a transparent conductive material such as ITO.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

Each of the organic layers OR1, OR2, and OR3 includes a plurality of functional layers. In addition, the first portion OR1*a* and the second portion OR1*b* of the organic layer OR1 include light emitting layers EM1 formed of the same material. The first portion OR2*a* and the second portion OR2*b* of the organic layer OR2 include light emitting layers EM2 formed of the same material. The first portion OR3*a* and the second portion OR3*b* of the organic layer OR3 include light emitting layers EM3 formed of the same material. The light emitting layers EM1, EM2, and EM3 are formed of materials emitting light of wavelength ranges different from each other.

The cap layers CP1, CP2, and CP3 are formed of, for example, multilayer bodies of transparent thin films. The multilayer body may include a thin film formed of an inorganic material and a thin film formed of an organic material. In addition, the plurality of thin films have refractive indexes different from one another. The materials of the thin films constituting the multilayer bodies are different from the materials of the upper electrodes UE1, UE2, and UE3 and different from the materials of the sealing layers SE1, SE2, and SE3. The cap layers CP1, CP2, and CP3 may be omitted.

A common voltage is supplied to the partition 6. This common voltage is supplied to each of the first portions UE1a, UE2a, and UE3a of the respective upper electrodes that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the light emitting layer EM1 of the first portion OR1a of the organic layer OR1 emits light of a red wavelength range. When a potential difference is formed between the lower electrode LE2 and the upper electrode UE2, the light emitting layer EM2 of the first portion OR2a of the organic layer OR2 emits light of a green wavelength range. When a potential difference is formed between the lower electrode LE3 and the upper electrode UE3, the light emitting layer EM3 of the first portion OR3a of the organic layer OR3 emits light of a blue wavelength range.

As another example, the light emitting layers of the organic layers OR1, OR2, and OR3 may emit light of the same color (for example, white). In this case, the display device DSP may comprise color filters that convert the light emitted from the light emitting layers into light of the colors corresponding to the sub-pixels SP1, SP2, and SP3. In addition, the display device DSP may comprise quantum dots that are excited by the light emitted from the light-emitting layers and generate light of the colors corresponding to the sub-pixels SP1, SP2, and SP3.

Figure 4:
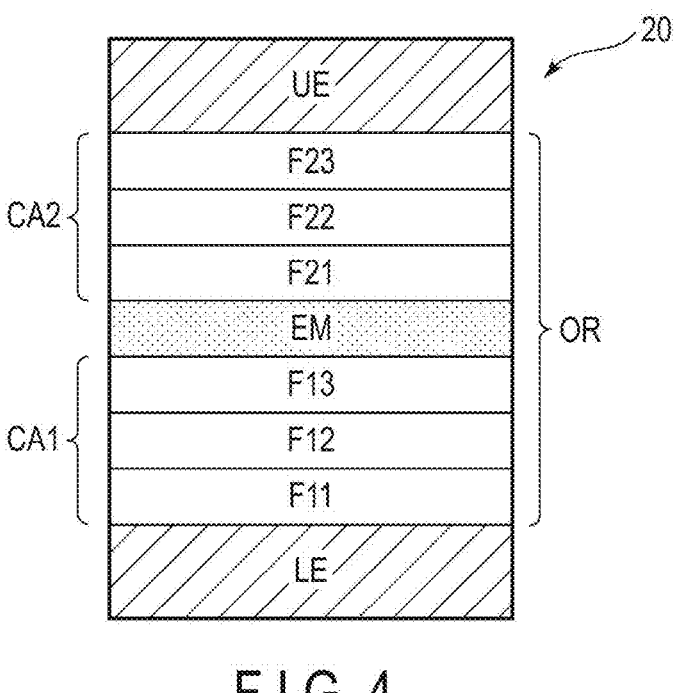
FIG. 4 is a view showing an example of a configuration of the display device 20.

FIG. 4 is a view showing an example of a configuration of the display device 20.

The lower electrode LE shown in FIG. 4 corresponds to each of the lower electrodes LE1, LE2, and LE3 shown in FIG. 3. The organic layer OR shown in FIG. 4 corresponds to each of the organic layers OR1, OR2, and OR3 shown in FIG. 3. The upper electrode UE shown in FIG. 4 corresponds to each of the upper electrodes UE1, UE2, and UE3 shown in FIG. 3.

The organic layer OR includes a carrier adjustment layer CA1, a light emitting layer EM, and a carrier adjustment layer CA2. The carrier adjustment layer CA1 is located between the lower electrode LE and the light emitting layer EM, and the carrier adjustment layer CA2 is located between the light emitting layer EM and the upper electrode UE. The carrier adjustment layers CA1 and CA2 include a plurality of functional layers. An example where the lower electrode LE corresponds to the anode and the upper electrode UE corresponds to the cathode will be described below.

The carrier adjustment layer CA1 includes a hole-injection layer F11, a hole-transport layer F12, an electron blocking layer F13, and the like, as functional layers. The hole-injection layer F11 is arranged on the lower electrode LE, the hole-transport layer F12 is arranged on the hole-injection layer F11, the electron blocking layer F13 is arranged on the hole-transport layer F12, and the light emitting layer EM is arranged on the electron blocking layer F13.

The carrier adjustment layer CA2 includes a hole blocking layer F21, an electron-transport layer F22, an electron-injection layer F23, and the like, as functional layers. The hole blocking layer F21 is arranged on the light emitting layer EM, the electron-transport layer F22 is arranged on the hole blocking layer F21, the electron-injection layer F23 is arranged on the electron-transport layer F22, and the upper electrode UE is arranged on the electron-injection layer F23.

In addition to the above-described functional layers, the carrier adjustment layers CA1 and CA2 may include the other functional layers such as a carrier generation layer as needed or at least one of the above-described functional layers may be omitted.

Next, an example of a method of manufacturing the display device DSP will be described.

Figure 5:
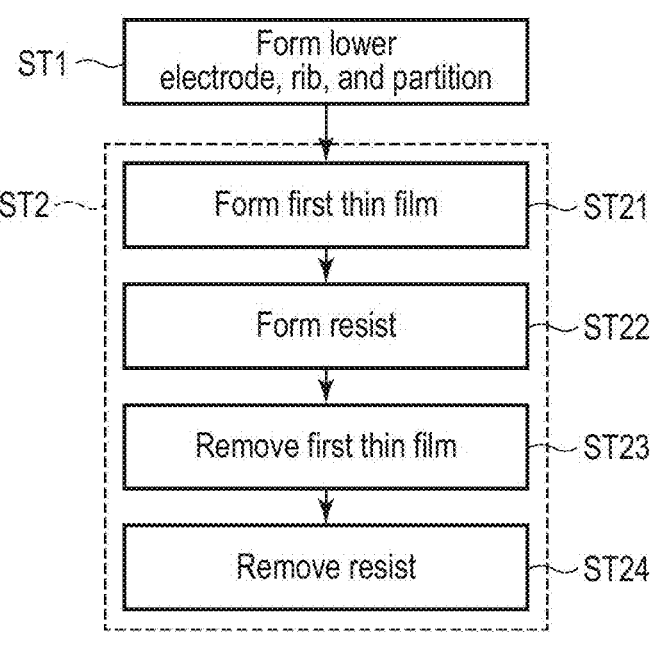
FIG. 5 is a flowchart illustrating an example of a method of manufacturing the display device DSP.

FIG. 5 is a flowchart illustrating an example of a method of manufacturing the display device DSP.

The manufacturing method illustrated here is roughly divided into a process of preparing a processing substrate SUB which is to be a base for each of the sub-pixels SPα, SPβ, and SPγ (step ST1), and a process of forming the sub-pixel SPα (step ST2). After step ST2, a process of forming the sub-pixel SPβ is performed similarly to the process of forming the sub-pixel SPα, and a process of forming the sub-pixel SPγ is further performed. The sub-pixels SPα, SPβ, and SPγ correspond to the above-described sub-pixels SP1, SP2, and SP3.

In step ST2, a first thin film 31 including a light emitting layer EMα is first formed on the processing substrate SUB (step ST21). After that, a resist 41 patterned in a predetermined shape is formed on the first thin film 31 (step ST22). After that, the first thin film is partially removed by etching using the resist 41 as a mask (step ST23). After that, the resist 41 is removed (step ST24). The sub-pixel SPα is thereby formed. The sub-pixel SPα comprises a display element 21 including the first thin film 31 in a predetermined shape.

The process of forming the sub-pixel SPβ includes the same processes as steps ST21 to ST24, but a second thin film 32 including a light emitting layer EMβ is formed instead of the first thin film 31 in step ST21. Then, the sub-pixel SPβ is formed by patterning the second thin film 32. The sub-pixel SPβ comprises a display element 22 including the second thin film 32 in a predetermined shape.

The process of forming the sub-pixel SPγ includes the same processes as steps ST21 to ST24, but a third thin film 33 including a light emitting layer EMγ is formed instead of the first thin film 31 in step ST21. Then, the sub-pixel SPγ is formed by patterning the third thin film 33. The sub-pixel SPγ comprises a display element 23 including the third thin film 33 in a predetermined shape.

The light emitting layers EMα, EMβ, and EMγ are formed of materials emitting light of wavelength ranges different from each other.

Steps ST1 and ST2 will be specifically described below.

Figure 6:
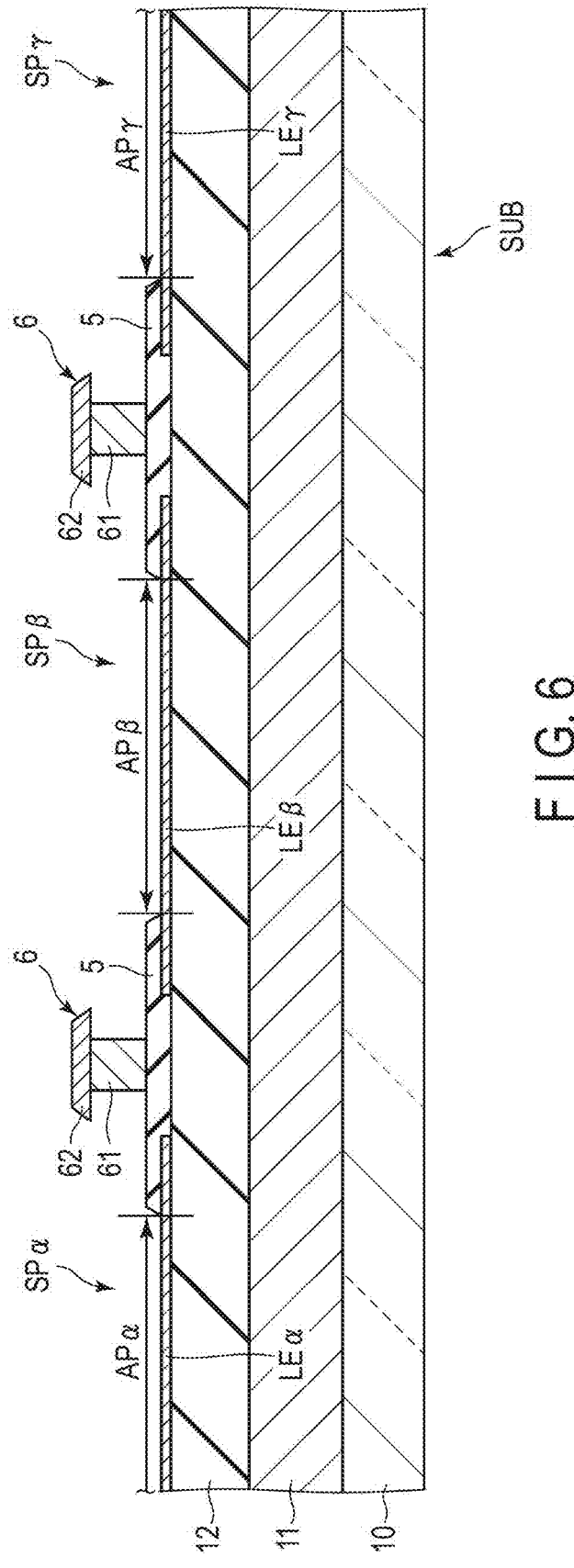
FIG. 6 is a view illustrating a process of preparing a processing substrate.

First, in step ST1, as shown in FIG. 6, a processing substrate SUB where a lower electrode LEα of the sub-pixel SPα, a lower electrode LEβ of the sub-pixel SPβ, a lower electrode LEγ of the sub-pixel SPγ, the rib 5 including apertures APα, APβ, and APγ that overlap the lower electrodes LEα, LEβ, and LEγ, respectively, and the partition 6 including a lower portion 61 arranged on the rib 5 and an upper portion 62 arranged on the lower portion 61 and protruding from the side surface of the lower portion 61, are formed above the substrate 10, is prepared. In FIG. 7 to FIG. 12, illustration of the substrate 10 and the circuit layer 11 lower than the insulating layer 12 is omitted.

Then, in step ST21, as shown in FIG. 7, the first thin film 31 is formed over the sub-pixels SPα, SPβ, and SPγ. The process of forming the first thin film 31 includes a process of forming an organic layer OR10 including the light emitting layer EMα on the processing substrate SUB, a process of forming an upper electrode UE10 on the organic layer OR10, a process of forming a cap layer CP10 on the upper electrode UE10, and a process of forming a sealing layer SE10 on the cap layer CP10. In other words, in the example illustrated, the first thin film 31 includes the organic layer OR10, the upper electrode UE10, the cap layer CP10, and the sealing layer SE10.

The organic layer OR10 includes a first organic layer OR11, a second organic layer OR12, a third organic layer OR13, a fourth organic layer OR14, and a fifth organic layer OR15. The first organic layer OR11, the second organic layer OR12, the third organic layer OR13, the fourth organic layer OR14, and the fifth organic layer OR15 include the light emitting layers EMα formed of the same material.

The first organic layer OR11 is formed to cover the lower electrode LEα. The second organic layer OR12 is separated from the first organic layer OR11, and is located on the upper portion 62 of the partition 6 between the lower electrode LEα and the lower electrode LEβ. The third organic layer OR13 is separated from the second organic layer OR12 and formed to cover the lower electrode LEβ. The fourth organic layer OR14 is separated from the third organic layer OR13, and is located on the upper portion 62 of the partition 6 between the lower electrode LEβ and the lower electrode LEγ. The fifth organic layer OR15 is separated from the fourth organic layer OR14 and formed to cover the lower electrode LEγ.

The upper electrode UE10 includes a first upper electrode UE11, a second upper electrode UE12, a third upper electrode UE13, a fourth upper electrode UE14, and a fifth upper electrode UE15.

The first upper electrode UE11 is located on the first organic layer OR11, and is in contact with the lower portion 61 of the partition 6 between the lower electrode LEα and the lower electrode LEβ. The second upper electrode UE12 is separated from the first upper electrode UE11, and is located on the second organic layer OR12 between the lower electrode LEα and the lower electrode LEβ. The third upper electrode UE13 is separated from the second upper electrode UE12, and is located on the third organic layer OR13. In addition, in the In the example illustrated, the third upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ, but may be in contact with either of the lower portions 61. The fourth upper electrode UE14 is separated from the third upper electrode UE13, and is located on the fourth organic layer OR14 between the lower electrode LEβ and the lower electrode LEγ. The fifth upper electrode UE15 is separated from the fourth upper electrode UE14, located on the fifth organic layer OR15, and is in contact with the lower portion 61 of the partition 6 between the lower electrode LEβ and the lower electrode LEγ.

The cap layer CP10 includes a first cap layer CP11, a second cap layer CP12, a third cap layer CP13, a fourth cap layer CP14, and a fifth cap layer CP15.

The first cap layer CP11 is located on the first upper electrode UE11. The second cap layer CP12 is separated from the first cap layer CP11 and is located on the second upper electrode UE12. The third cap layer CP13 is separated from the second cap layer CP12 and is located on the third upper electrode UE13. The fourth cap layer CP14 is separated from the third cap layer CP13 and is located on the fourth upper electrode UE14. The fifth cap layer CP15 is separated from the fourth cap layer CP14 and is located on the fifth upper electrode UE15.

The sealing layer SE10 is formed of a silicon nitride which is an inorganic material. Such a sealing layer SE10 is formed by plasma chemical vapor deposition (CVD) and, in forming the sealing layer SE10, the substrate temperature is desirably set to be low, from the viewpoint of reducing thermal damage to the previously formed organic layer OR10. For example, the substrate temperature is set 120° C. or lower. Thus, the sealing layer SE10 formed at a relatively low temperature tends to contain a large amount of hydrogen (H).

The sealing layer SE10 is formed to cover the first cap layer CP11, the second cap layer CP12, the third cap layer CP13, the fourth cap layer CP14, the fifth cap layer CP15, and the partition 6. The sealing layer SE10 covering the partition 6 is in contact with a lower part of the upper portion 62 and the side surface of the lower portion 61.

The sealing layer SE10 has a thickness Tα in the sub-pixel SPα, a thickness Tβ, in the sub-pixel SPβ, and a thickness Tγ in the sub-pixel SPγ. The thickness Tα, the thickness Tβ, and the thickness Tγ are substantially equal.

After that, in step ST22, as shown in FIG. 8, a resist is applied onto the sealing layer SE10 and patterned. The resist 41 formed by this patterning covers the sub-pixel SPα. In other words, the resist 41 is arranged just above the lower electrode LEα, the first organic layer OR11, the first upper electrode UE11, and the first cap layer CP11. In addition, the resist 41 extends above the partition 6 from the sub-pixel SPα. The resist 41 is arranged on the sub-pixel SPα side (left side in the figure), at a position between the sub-pixel SPα and the sub-pixel SPβ, and exposes the sealing layer SE10 on the sub-pixel SPβ side (right side in the figure). In the example illustrated, the resist 41 exposes the sealing layer SE10 at the sub-pixel SPβ and the sub-pixel SPγ.

A thickness T1 of the sealing layer SE10 between the upper portion 62 of the partition 6 and the resist 41 larger than a thickness T2 of the lower portion 61.

A width W1 of the resist 41 just above the upper portion 62 is larger than a width W2 of the upper portion 62 protruding from the side surface of the lower portion 61 and is smaller than a full width W3 of the upper portion 62. In one example, the width W1 of the resist 41 is 1 μm or more.

After that, in step ST23, as shown in FIG. 9, anisotropic dry etching is performed as first etching of the first thin film 31 using the resist 41 as a mask, to reduce the thickness of the sealing layer SE10 exposed from the resist 41.

An etching reactive gas introduced into a chamber where the anisotropic dry etching is performed is, for example, fluorine-based gas and does not contain oxygen as additive gas. In the example illustrated, sulfur hexafluoride ($SF_6$) is used as an example of fluorine-based gas.

In anisotropic dry etching, side etching is less likely to progress than that in isotropic dry etching. For this reason, side etching of the sealing layer SE10 is suppressed and the thickness T1 of the sealing layer SE10 is maintained at a position between the upper portion 62 and the resist 41. The thickness T3 of the sealing layer SE10 exposed from the resist 41 just above the top 62 is smaller than the thickness T1. However, the thickness T3 is larger than 0 μm. Each of the partition 6 between the sub-pixel SPα and the sub-pixel SPβ, and the second organic layer OR12, the second upper electrode UE12, and the second cap layer CP12 located on the partition 6 is covered with the sealing layer SE10.

The thickness Tβ, of the sealing layer SE10 in the sub-pixel SPβ is smaller than the thickness Tα of the sealing layer SE10 in the sub-pixel SPα. In addition, in the example illustrated, the thickness Tγ of the sealing layer SE10 in the sub-pixel SPγ is also smaller than the thickness Tα. In one example, the thickness Tβ, and the thickness Tγ are substantially equal to the thickness T3. The thickness Tβ, and the thickness Tγ is larger than 0 μm. In other words, the sealing layer SE10 remains in the sub-pixel SPβ and the sub-pixel SPγ, and the third cap layer CP13 and the fifth cap layer CP15 are covered with the sealing layer SE10.

In addition, each of the partition 6 between the sub-pixel SPβ and the sub-pixel SPγ, and the fourth organic layer OR14, the fourth upper electrode UE14, and the fourth cap layer CP14 located on the partition 6 is covered with the sealing layer SE10.

After that, as shown in FIG. 10, isotropic dry etching is performed as second etching of the first thin film 31 using the resist 41 as a mask, to remove the sealing layer SE10 exposed from the resist 41.

An etching reactive gas introduced into the chamber where the isotropic dry etching is performed is, for example, fluorine-based gas and contains oxygen as additive gas. In other words, isotropic dry etching is performed using a mixture gas of fluorine-based gas and oxygen. In the example illustrated, sulfur hexafluoride ($SF_6$) is used as an example of fluorine-based gas.

The third cap layer CP13 of the sub-pixel SPβ and the fifth cap layer CP15 of the sub-pixel SPγ are exposed from the sealing layer SE10 by this isotropic dry etching. The sealing layer SE10 remains in the sub-pixel SPα.

In addition, the sub-pixel SPα side of each of the lower portion 61, the upper portion 62, and the second cap layer CP12 between the sub-pixel SPα and the sub-pixel SPβ, is covered with the sealing layer SE10 while the sub-pixel SPβ side is exposed from the sealing layer SE10. The lower portion 61, the upper portion 62, and the fourth cap layer CP14 between the sub-pixel SPβ and the sub-pixel SPγ is exposed from the sealing layer SE10. Such the cap layer CP10 functions as an etching stopper layer when the sealing layer SE10 is removed by dry etching.

Processing conditions for the above-described anisotropic dry etching and isotropic dry etching are as follows.

The anisotropic dry etching is performed for a predetermined time such that the thickness of the sealing layer SE10 is sufficiently reduced. In contrast, the isotropic dry etching is performed until an end point is detected. The end point can be detected by, for example, monitoring spectrum of plasma in the chamber.

The processing time of the isotropic dry etching is shorter than the processing time of the anisotropic dry etching. In other words, the amount of the sealing layer SE10 removed by the anisotropic dry etching is more than the amount of the sealing layer SE10 removed by the isotropic dry etching. In other words, side etching of the sealing layer SE10 is suppressed since the processing time of the isotropic dry etching is shortened.

The pressure in the chamber where the anisotropic dry etching is performed is lower than the pressure in the chamber where the isotropic dry etching is performed.

The bias power of a stage on which the processing substrate is arranged when performing the anisotropic dry etching is larger than the bias power of a stage on which the processing substrate is arranged when performing the isotropic dry etching.

The flow rate of fluorine-based gas introduced into the chamber where the anisotropic dry etching is performed is smaller than the flow rate of fluorine-based gas introduced into the chamber where the isotropic dry etching is performed. As an example of gas species of etching reaction gas introduced when performing anisotropic dry etching and isotropic dry etching, not only sulfur hexafluoride ($SF_6$) described above, but also other fluorine-based gases such as methane tetrafluoride ($CF_4$), ethane hexafluoride ($C_2F_6$), methane trifluoride ($CHF_3$), and nitrogen trifluoride ($NF_3$) are applicable.

Thus, the sealing layer SE10 of the first thin film 31 is subjected to anisotropic dry etching and then isotropic dry etching, and is thereby formed to have a predetermined shape.

As a comparative example, if oxygen is not added when the isotropic dry etching is performed, carbon-based products are likely to appear due to carbon (C) contained in the resist 41 and hydrogen (H) contained in the sealing layer SE10. The product confirmed by the present inventor had a thread-like shape and was hung down from the upper portion 62 of the partition 6. If the product as described above appears in the process of removing the sealing layer SE10, the sealing layer SE10 may not be completely removed.

For example, if the product appears downwardly from the upper portion 62 in the partition 6 between the sub-pixel SPβ and the sub-pixel SPγ, the sealing layer SE10 may remain on the side surface of the lower portion 61, and the lower portion 61 and the upper electrode in each of the sub-pixels SPβ and SPγ cannot be electrically connected to each other. Thus, the appearance of the product during the isotropic dry etching may cause defects such as connection failure of the upper electrode and sealing failure, and the like in a subsequent sub-pixel formation process. In addition, if the isotropic dry etching is further performed to remove the sealing layer in a case where a part of the sealing layer SE10 remains, elements of the sub-pixel previously exposed from the sealing layer SE10 may be damaged.

According to the embodiment, the carbon component is exhausted as carbon dioxide by adding oxygen during the isotropic dry etching. Thus, the appearance of the product during the isotropic dry etching is suppressed, and the sealing layer SE10 of the sub-pixel which is not covered with the resist 41 or the sealing layer SE10 covering the partition 6 is securely removed. For this reason, the upper electrode and the lower portion can be securely electrically connected to each other in the subsequent sub-pixel formation process. In addition, damage to the elements of each sub-pixel due to excessive dry etching is suppressed. Therefore, the reliability can be improved.

After that, as shown in FIG. 11, third etching of the first thin film 31 using the resist 41 as a mask is performed. In the third etching, a part of the second organic layer OR12, all parts of the third organic layer OR13, all parts of the fourth organic layer OR14, all parts of the fifth organic layer OR15, a part of the second upper electrode UE12, all parts of the third upper electrodes UE13, all parts of the fourth upper electrode UE14, all parts of the fifth upper electrode UE15, a part of the second cap layer CP12, all parts of the third cap layer CP13, all parts of the fourth cap layer CP14, and all parts of the fifth cap layer CP15, which are exposed from the resist 41, are removed. As a result, the lower electrode LEβ is exposed in the sub-pixel SPβ, and the lower electrode LEγ is exposed in the sub-pixel SPγ.

As regards the partition 6 between the sub-pixel SPα and the sub-pixel SPβ, just above the upper portion 62, the second organic layer OR12, the second upper electrode UE12, the second cap layer CP12, and the sealing layer SE10 remain on the sub-pixel SPα side, and the second organic layer OR12, the second upper electrode UE12, the second cap layer CP12, and the sealing layer SE10 are removed on the sub-pixel SPβ side. For this reason, the upper portion 62 is exposed on the sub-pixel SPβ side.

In addition, as regards the rib 5 between the sub-pixel SPα and the sub-pixel SPβ, the sub-pixel SPβ side is exposed.

In addition, as regards the partition 6 between the sub-pixel SPβ and the sub-pixel SPγ, the lower portion 61 and the upper portion 62 are exposed.

In addition, as regards the rib 5 between the sub-pixel SPβ and the sub-pixel SPγ, the each of the sub-pixel SPβ side and the sub-pixel SPγ side is exposed.

After that, as shown in FIG. 12, the resist 41 is removed in step ST24. The sealing layer SE10 of the sub-pixel SPα is thereby exposed. The display element 21 is formed in the sub-pixel SPα through steps ST21 to ST24. The display element 21 is constituted by the lower electrode LEα, the first organic layer OR11, the first upper electrode UE11, and the first cap layer CP11. In addition, the display element 21 is covered with the sealing layer SE10.

In the example described above, the sub-pixel SPα is any one of the sub-pixels SP1, SP2, and SP3 shown in FIG. 2. For example, when the sub-pixel SPα corresponds to the sub-pixel SP1, the lower electrode LEα corresponds to the lower electrode LE1, the first organic layer OR11 corresponds to the first portion OR1a, the second organic layer OR12 corresponds to the second portion OR1b, the light emitting layer EMα corresponds to the first light emitting layer EM1, the first upper electrode UE11 corresponds to the first portion UE1a, the second upper electrode UE12 corresponds to the second portion UE1b, the first cap layer CP11 corresponds to the first portion CP1a, the second cap layer CP12 corresponds to the second portion CP1b, and the sealing layer SE10 corresponds to the sealing layer SE1.

Next, the present inventor prepared gases with different mixture ratios of sulfur hexafluoride and oxygen, and performed isotropic dry etching of the sealing layer using these gases. Then, the present inventor confirmed the presence or absence of carbon-based product after performing the dry etching until the end point was detected. The sealing layer is formed of silicon nitride (SiN) as described above.

FIG. 13 is a table summarizing the mixture ratios of gases used for isotropic dry etching and the presence or absence of the product.

The mixture ratios shown in the figure are volume ratios, and the processing time in each experiment is set to be constant.

In Experiment 1, the isotropic dry etching was performed using gas of only sulfur hexafluoride as the etching reactive gas. In other words, the gas mixture ratio is as follows.

$SF_6:O_2=100:0$

In Experiment 1, appearance of the product was confirmed.

In Experiment 2, the isotropic dry etching was performed using gas formed by adding 10% oxygen to sulfur hexafluoride. In other words, the gas mixture ratio is as follows.

$SF_6:O_2=90:10$

In Experiment 2, appearance of the product was confirmed.

In Experiment 3, the isotropic dry etching was performed using gas formed by adding 30% oxygen to sulfur hexafluoride. In other words, the gas mixture ratio is as follows.

$SF_6:O_2=70:30$

In Experiment 3, no products appeared.

While the appearance of the product was further suppressed as the volume ratio of oxygen became larger, and the etching rate decreased and the sealing layer could not be completely removed within a certain time when the volume ratio of oxygen exceeded 40%.

Based on these experimental results, the mixture ratio of fluorine-based gas and oxygen in the mixed gas is desirably in the range of 80:20 to 60:40 at fluorine-based gas:oxygen (volume ratio).

As explained above, according to the embodiment, a method of manufacturing the display device capable of increasing the reliability and improving the manufacturing yield can be provided.

All of the methods of manufacturing display devices that can be implemented by a person of ordinary skill in the art through arbitrary design changes to the methods of manufacturing display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device manufacturing method comprising:

preparing a processing substrate where a lower electrode, a rib including an aperture overlapping the lower electrode, and a partition including a lower portion arranged on the rib and an upper portion arranged on the lower portion and protruding from a side surface of the lower portion, are formed above a substrate;

simultaneously forming a first organic layer covering the lower electrode, and a second organic layer separated from the first organic layer and located on the upper portion;

simultaneously forming a first upper electrode located on the first organic layer and being in contact with the lower portion, and a second upper electrode separated from the first upper electrode and located on the second organic layer;

forming a sealing layer located above the first upper electrode and the second upper electrode and covering the partition;

forming a resist covering a part of the sealing layer, performing anisotropic dry etching using the resist as a mask to reduce a thickness of the sealing layer exposed from the resist; and performing isotropic dry etching using the resist as a mask and using a mixture gas of fluorine-based gas and oxygen to remove the sealing layer exposed from the resist, wherein the rib is formed on the lower electrode, is in direct contact with the lower electrode, and covers a peripheral portion of the lower electrode, the lower portion of the partition is formed on the rib and is in direct contact with the rib, the upper portion of the partition is formed on the lower portion of the partition and is in direct contact with the lower portion of the partition, the first organic layer is in direct contact with the lower electrode through the aperture, the second organic layer is in direct contact with the upper portion of the partition, the first upper electrode is in direct contact with the first organic layer, the second upper electrode is in direct contact with the second organic layer, the sealing layer is in direct contact with the lower portion of the partition and the upper portion of the partition, the lower electrode, the first organic layer and the first upper electrode are stacked in a third direction, the peripheral portion of the lower electrode is located between the substrate and the rib in the third direction, the peripheral portion of the lower electrode is closer to the substrate compared to the rib the lower portion of the partition is located between the rib and the upper portion of the partition in the third direction, the rib is closer to the substrate compared to the upper portion of the partition in the third direction, the second organic layer is located between the upper portion of the partition and the second upper electrode in the third direction, the upper portion of the partition is closer to the substrate compared to the second upper electrode in the third direction, the second upper electrode is located between the second organic layer and the sealing layer in the third direction, the second organic layer is closer to the substrate compared to the sealing layer in the third direction, a first cap layer located between the first upper electrode and the sealing layer in the third direction, and a second cap layer separated from the first cap layer and located between the second upper electrode and the sealing layer in the third direction are formed, the first cap layer is in direct contact with the first upper electrode and the sealing layer, and the second cap layer is in direct contact with the second upper electrode and the sealing layer.

2. The method of claim 1, wherein the first organic layer and the second organic layer include light emitting layers formed of a same material.

3. The method of claim 1, wherein the sealing layer is formed of a silicon nitride.

4. The method of claim 3, wherein the sealing layer is formed at a temperature lower than or equal to 120° C.

5. The method of claim 1, wherein an etching reactive gas for performing the anisotropic dry etching does not contain oxygen.

6. The method of claim 1, wherein a mixture ratio of fluorine-based gas to oxygen in the mixed gas is in the range of 80:20 to 60:40 at fluorine-based gas:oxygen (volume ratio).

7. The method of claim 1, wherein a processing time of the isotropic dry etching is shorter than a processing time of the anisotropic dry etching.

8. The method of claim 1, wherein the first cap layer and the second cap layer are etching stopper layers for the isotropic dry etching.

9. The method of claim 1, further comprising:

after removing the sealing layer, performing etching using the resist as a mask to remove a part of the second cap layer, a part of the second upper electrode, and a part of the second organic layer.

10. The method of claim 1, wherein the lower electrode, the first organic layer and the first upper electrode are stacked in a third direction, and a width of the upper portion of the partition in a first direction orthogonal to the third direction is greater than a width of the lower portion of the partition in the first direction.

11. The method of claim 10, wherein the lower portion of the partition is formed of a conductive material.

12. The method of claim 11, wherein the upper portion of the partition is formed of a conductive material.

13. The method of claim 10, wherein a thickness of the partition in the third direction is greater than a thickness of the rib in the third direction.

14. The method of claim 10, wherein a thickness of the sealing layer in the third direction between the upper portion of the partition and the resist is greater than a thickness of the lower portion of the partition in the third direction.

* * * * *